(12) United States Patent
Brown et al.

(10) Patent No.: US 9,408,304 B2
(45) Date of Patent: Aug. 2, 2016

(54) THROUGH PRINTED CIRCUIT BOARD (PCB) VIAS

(71) Applicant: INTERNATIONAL BUSINESS MACHINES CORPORATION, Armonk, NY (US)

(72) Inventors: Dana H. Brown, Essex Junction, VT (US); Hanyi Ding, Colchester, VT (US); Yan Ding, Essex Junction, VT (US); John S. Ferrario, Waterbury, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 198 days.

(21) Appl. No.: 14/161,228

(22) Filed: Jan. 22, 2014

(65) Prior Publication Data

US 2015/0208502 A1 Jul. 23, 2015

(51) Int. Cl.
| | |
|---|---|
| *H05K 1/11* | (2006.01) |
| *H05K 3/46* | (2006.01) |
| *H05K 1/09* | (2006.01) |
| *H05K 1/02* | (2006.01) |

(52) U.S. Cl.
CPC .............. *H05K 1/115* (2013.01); *H05K 1/0298* (2013.01); *H05K 1/09* (2013.01); *H05K 3/4697* (2013.01); *Y10T 29/49004* (2015.01)

(58) Field of Classification Search
CPC .................................................... H05K 1/0222
See application file for complete search history.

(56) References Cited

U.S. PATENT DOCUMENTS

| | | | |
|---|---|---|---|
| 5,199,879 A * | 4/1993 | Kohn et al. ................ | 439/63 |
| 5,644,277 A | 7/1997 | Gulick et al. | |
| 6,528,984 B2 | 3/2003 | Beaman et al. | |
| 7,250,780 B2 | 7/2007 | Hembree et al. | |
| 7,470,864 B2 * | 12/2008 | Ho et al. ................ | 174/262 |
| 2005/0098348 A1* | 5/2005 | Okumichi et al. ........... | 174/262 |
| 2007/0205847 A1 | 9/2007 | Kushta et al. | |

(Continued)

FOREIGN PATENT DOCUMENTS

| | | |
|---|---|---|
| CN | 102361119 A | 2/2012 |
| TW | 200841511 A | 10/2008 |

(Continued)

OTHER PUBLICATIONS

Kotzev, M. et al., "Bandwidth Study of Recessed Probe Launch Variations for Broadband Measurement of Embedded PCB Structures", German Microwave Conference, Mar. 16-18, 2009, 4 pages (Continued)

*Primary Examiner* — Jeremy C Norris
(74) *Attorney, Agent, or Firm* — Anthony Canale; Andrew M. Calderon; Roberts Mlotkowski Safran Cole & Calderon, P.C.

(57) ABSTRACT

A broadband through printed circuit board (PCB) for millimeter wave application and methods of manufacture are disclosed. The structure includes a multiple layered body and an opening in the multiple layered body. The structure further includes at least one signal via extending through the opening. The structure further includes ground vias extending through the opening and on opposing sides of the at least one signal via. The structure further includes a ground plate above and below the opening and electrically connected to the ground vias at respective ends. The structure further includes a microstrip signal via above and below the opening and electrically connected to the at least one signal via.

20 Claims, 8 Drawing Sheets

(56) References Cited

U.S. PATENT DOCUMENTS

| | | |
|---|---|---|
| 2008/0278259 A1 | 11/2008 | Ni et al. |
| 2010/0259346 A1 | 10/2010 | Runyon et al. |
| 2011/0241794 A1 | 10/2011 | Pao et al. |
| 2011/0279195 A1 | 11/2011 | Kushta et al. |

FOREIGN PATENT DOCUMENTS

| | | |
|---|---|---|
| WO | 2005086554 A1 | 9/2005 |
| WO | 2007102597 A1 | 9/2007 |

OTHER PUBLICATIONS

Chiu, J. et al., "A PCB-Compatible 3-dB Coupler Using Microstrip-to-CPW Via-Hole Transitions," Microwave and Wireless Components Letters, IEEE, vol. 16, No. 6, Jun. 2006, pp. 369-371.

Stark, A., et al., A Broadband Vertical Transition for Millimeter-Wave Applications, Proceedings of the 38th European Microwave Conference, Oct. 2008, Amsterdam, The Netherlands, pp. 476-479.

Stark, A., "Defected and Floating Ground Structures for Vertical Interconnects", EuMA, Oct. 2009, Rome, Italy, pp. 153-156.

\* cited by examiner

US 9,408,304 B2

THROUGH PRINTED CIRCUIT BOARD (PCB) VIAS

FIELD OF THE INVENTION

The invention relates to semiconductor structures and, more particularly, to broadband through printed circuit board (PCB) vias for millimeter wave applications and methods of manufacture.

BACKGROUND

With semiconductor technology development, more millimeter wave ICs (integrated circuits) come to the final production tests. To realize the production tests, a thick probe interface board (PIB) for wafer tests or a thick device interface board (DIB) for module tests is needed. Due to their high profile, which can be an obstacle to the wafer or the module handler, connectors can only be mounted on the side of PIB or DIB opposite to the side for the probe card or socket. This requires through PCB (printed circuit board) vias with good signal integrity for propagating the signals from one side to another.

However, large thicknesses of the PIB or DIB (e.g., 100 mil or larger) and the high application frequency (e.g., several tens of GHz to 100 GHz and beyond) make the through PCB vias no longer a short discontinuity for signals. To this end, the PIB or DIB needs to be carefully designed in order to accommodate thick boards and high frequencies.

SUMMARY

In an aspect of the invention, a structure comprises a multiple layered body and an opening in the multiple layered body. The structure further comprises at least one signal via extending through the opening. The structure further comprises ground vias extending through the opening and on opposing sides of the at least one signal via. The structure further comprises a ground plate above and below the opening and electrically connected to the ground vias at respective ends. The structure further comprises a microstrip signal via above and below the opening and electrically connected to the at least one signal via.

In an aspect of the invention, a direct wafer probing device comprises a board and contacts at a bottom of the board. One or more broadband through conductive vias contact the contacts at the bottom of the board. One or more coaxial connectors are on a top of the board, connecting to the one or more broadband through conductive vias.

In an aspect of the invention, a method of forming a board, comprises: determining a thickness of a board based on application requirements; determining via diameter and via pad diameter based on board design constraints; determining a width of a launch trace which forms a microstrip signal line; determining an initial distance between a signal via and two dominant ground vias for a required impedance; and determining an initial clearance size of return grounds for the signal via and an opening size on ground/power planes by a minimum spacing.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the direct wafer probing solution, which comprises the structures of the present invention. In still further embodiments, a method in a computer-aided design system is provided for generating a functional design model of the direct wafer probing solution. The method comprises generating a functional representation of the structural elements of the direct wafer probing solution.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to broadband through printed circuit board (PCB) vias for millimeter wave applications and methods of manufacture. In particular embodiments, the present invention is directed to a structure and method of super broadband through PCB vias structured to support production wafer probing solutions for high frequency applications, e.g., millimeter wave applications. In embodiments, the wafer probe may use one signal via (line) or two signal vias, two dominant ground vias and a ground opening, as well as additional via pads to form a controlled impedance interconnect block. In such configurations, the present invention provides a broadband signal path from a top to a bottom of a PCB (more than 100 mil) having up to about 100 GHz bandwidth of −10 dB return loss. The design method provides parameters and a procedure to optimize the via bandwidth.

In embodiments, the direct wafer probing solution for high frequencies (e.g., millimeter wave) comprises contacts located at a lower surface of a PCB and structured to couple to contacts located on a wafer under test. The direct wafer probing solution further comprises at least one broadband through PCB via coupled to at least one of the contacts, and at least one coaxial connector located on an upper surface of the PCB and coupled to the at least one broadband through PCB via.

Advantageously, the direct wafer probing solutions of the present invention show that the optimized design reaches −10 dB return loss bandwidth of beyond 100 GHz. The direct wafer probing solutions also provide a path with improved signal integrity from one side to another side of a thick PCB for millimeter wave and very high speed applications. Accordingly, the direct wafer probing solutions of the present invention can be used for very high frequencies, such as millimeter waves. The present invention also enables easy design and fabrication of a thick probe interface board (PIB) for wafer tests or a thick device interface board (DIB) for millimeter wave IC production tests.

The direct wafer probing solutions of the present invention can be manufactured in a number of ways using a number of different tools. In general, though, the methodologies and tools are used to form structures with dimensions in the micrometer scale. The methodologies, i.e., technologies, employed to manufacture the direct wafer probing solutions have been adopted from integrated circuit (IC) technology. For example, the structures of the present invention are realized in films of material patterned by photolithographic processes on the top of a wafer.

Figure 1A:
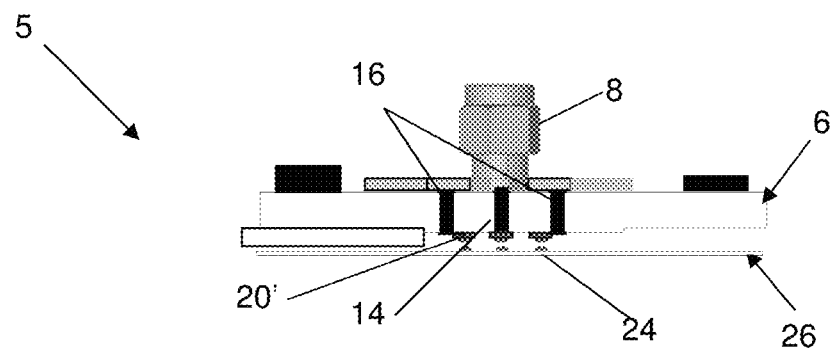
FIGS. 1a-1c show different views of a structure (e.g., direct wafer probing solution for high frequencies) and processing steps in accordance with aspects of the present invention.
Figure 1B:
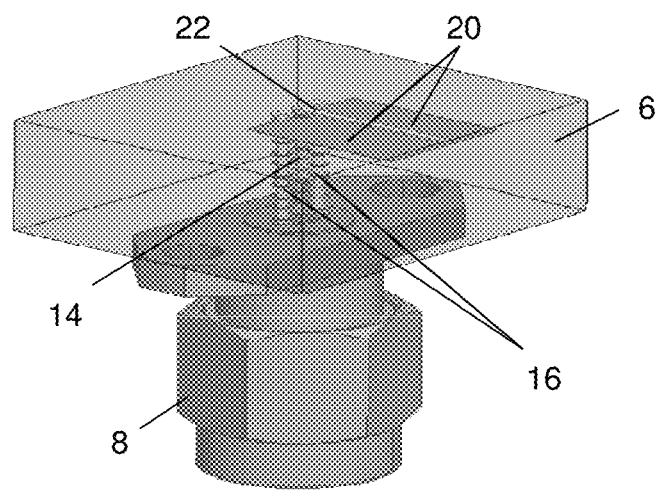
Figure 1C:
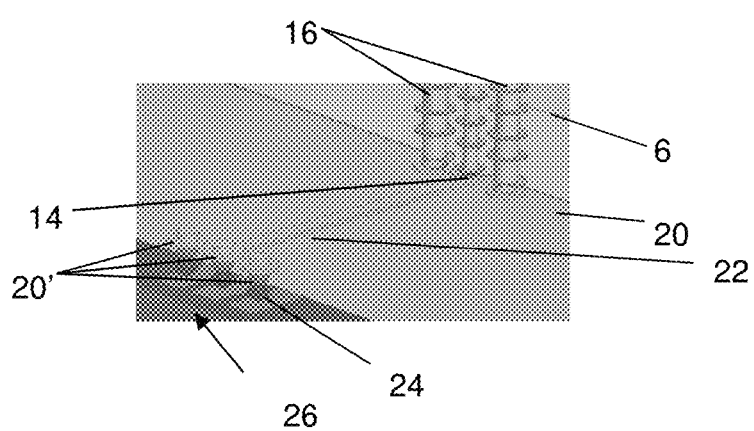

FIGS. 1a-1c show different views of a structure (e.g., direct wafer probing solution for high frequencies, such as millimeter wave wafer probing device) in accordance with aspects of the present invention. More specifically, FIGS. 1a-1c show a direct wafer probing solution with a ground-signal-ground implementation. It should be understood by those of skill in the art, though, that the direct wafer probing solution of FIGS. 1a-1c can also be implemented as a ground-signal-signal-ground implementation.

FIG. 1a shows a side view of a wafer probe 5, FIG. 1b shows a perspective view of the wafer probe 5, and FIG. 1c shows an exploded view of a bottom section of the wafer probe 5. In embodiments, the wafer probe 5 includes a body 6 coupled to a coaxial connector 8. It should be understood by those of skill in the art that more than one coaxial connector can be provided, based on a number of signal vias 14 and ground vias 16. Broadband through PCB conductive vias (e.g., signal via(s) 14 and ground vias 16) are formed in the body 6, electrically connecting on a top side to the coaxial connector 8. In embodiments, the signal via(s) 14 can be one or more (e.g., two) signal vias positioned between two ground vias 16.

As shown in FIGS. 1b and 1c, a ground plate 20 is formed in direct electrical contact with the ground vias 16 and a microstrip signal line 22 is formed in direct electrical contact with the signal via 14, at an opposing side to the coaxial connector 8. The microstrip signal line 22 and the ground plate 20 each have ground contacts 20' connecting to a solder connection or wire bond pads 24 on the wafer under test 26.

In embodiments, the signal via 14 and ground vias 16 can be formed by drilling within the body 6 and deposition of metal within the drilled hole. The deposition of metal can be, for example, electroplating. In alternative embodiments, the signal via 14 and ground vias 16 can be formed by conventional lithography, etching and deposition processes, during the buildup of layers forming the body. In embodiments, the signal via(s) 14 and ground vias 16 can be any metal such as, for example, copper or copper alloy. Also, the microstrip signal lines 22 and the ground plates 20 can be formed of similar materials, using conventional deposition processes (e.g., chemical vapor deposition) known to those of skill in the art.

Figure 2:
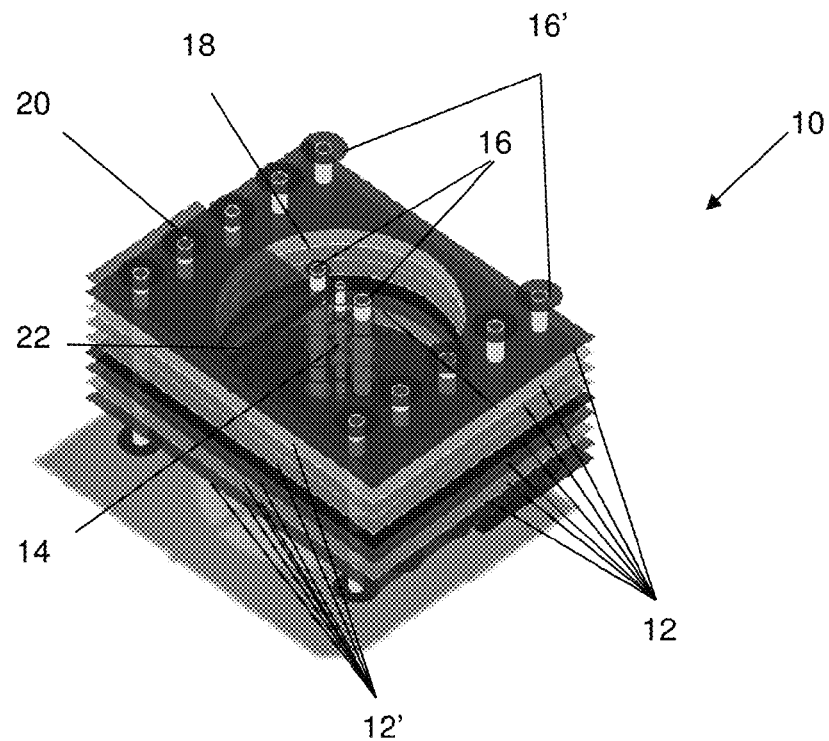
FIG. 2 shows a structure (e.g., direct wafer probe) and respective processing steps in accordance with aspects of the present invention.

FIG. 2 shows a structure (direct wafer probe) and respective processing steps in accordance with aspects of the present invention. In embodiments, the structure 10 can be implemented as a broadband through PCB via structure to support an above wafer probing solution for millimeter wave signal. In particular, the direct wafer probe 10 includes a plurality of alternating metal layers 12 and dielectric layers 12'. In embodiments, the metal layers 12 are copper or copper alloy layers; whereas, the dielectric layers 12' are any known insulating material such as, for example, any high frequency PCB material. By way of example, the dielectric layers 12' can be mica or other insulating materials. In embodiments, the top and bottom metal layers 12 can be copper coated with nickel and/or gold. In embodiments, the alternating metal layers 12 and dielectric layers 12' can be formed by any known deposition methods such as, for example, chemical vapor deposition (CVD) processes or bonding processes.

The direct wafer probe 10 of FIG. 2 further includes a signal via 14 and ground vias 16 (ground-signal-ground transmission line format), formed within an opening 18. In embodiments, the signal via 14 is positioned between the ground vias 16 within the opening 18 as further described with respect to FIGS. 4a-4f. By way of example, the opening 18 is formed in layers 3-10 each comprising alternating dielectric layers and conductive layers; although, other configurations are also contemplated by the present invention. In embodiments, secondary ground vias 16' are formed within the alternating metal layers 12 and dielectric layers 12', remote of the opening 18. In embodiments, the secondary ground vias 16' are symmetrically disposed about the opening 18 and can have self-contained ground shields. The signal via 14, ground vias 16 and secondary ground vias 16' are formed from any metal material using conventional methods.

By way of example, after formation of the alternating metal layers 12 and dielectric layers 12', vias can be drilled within the selected layers 12, 12' and filled with metal material to form the secondary ground vias 16'. The filling process can be a conventional metal plating processes such as electroplating. Alternatively, after each layer 12, 12' is deposited, a via can be formed by etching processes (e.g., reactive ion etching) or drilling processes, which are subsequently filled (e.g., plated) with the metal material to form the secondary ground vias 16'. Also, it should be understood by those of skill in the art that the opening 18 is formed in selected ones of the alternating metal layers 12 and dielectric layers 12' by an etching process as described herein. Moreover, selected ones of the alternating metal layers 12 and dielectric layers 12' can be drilled or individually etched to form a via for the subsequent formation of the signal via 14 and ground vias 16.

Still referring to FIG. 2, a top ground plate 20 is formed in contact with the ground vias 16 and secondary ground vias 16'. The top ground plate 20 can be formed of any metal or metal alloy, preferably of the same material as the ground vias 16. In embodiments, the top ground plate 20 is formed above the top layer 12 and the opening 18. In embodiments, the top ground plate 20 can be formed using any conventional deposition method known to those of skill in the art for forming a PCB. A microstrip signal line 22 is formed in contact with the signal via 14, preferably of the same material as the signal via 14. In embodiments, the microstrip signal line 22 can be formed at a different level than the top ground plate 20; although other levels are also contemplated by the present invention. As with the top ground plate 20, the microstrip signal line 22 can be formed in any conventional deposition process.

Figure 3:
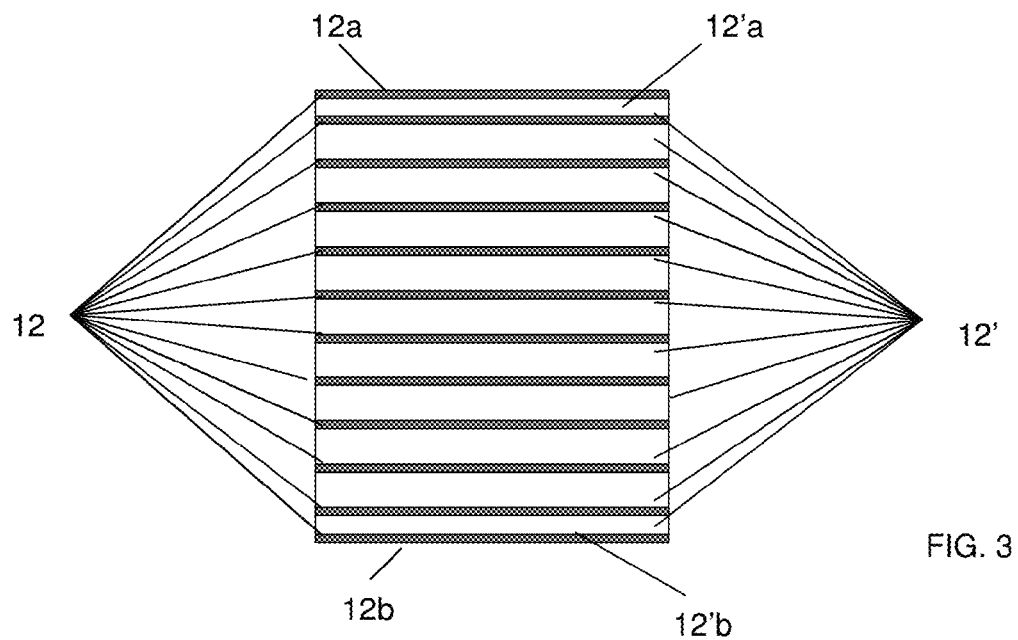
FIG. 3 shows alternating layers of the structure of FIG. 2 (and FIG. 5) in accordance with aspects of the present invention.

FIG. 3 shows the alternating layers of the structure in accordance with aspects of the present invention. In one preferred embodiment, the layers 12, 12' form a board with total thickness of about 113 mils+/−10%. In embodiments, the layers 12 are formed from any metal material with a preference of copper or copper alloy. In embodiments, the top and bottom layer 12a, 12b can be coated with nickel and/or gold. The top and bottom layer 12a, 12b can have a thickness of about 2 mil, with the remaining layers 12 having a thickness of about 0.7 mil; although other dimensions are also contemplated by the present invention. The layers 12' are preferably dielectric layers, e.g., mica. These layers 12' can vary in thickness, with the top and bottom layer 12'a, 12'b being about 4 mil each, and each remaining layer alternating between 12 mil and 10 mil. For example, in one illustrative non-limiting examples, the layers 12' (from either top to bottom or vice versa) can be 4 mil, 12 mil, 10 mil, 12 mil, 10 mil, 12 mil, 10 mil, 12 mil, 10 mil, 12 mil, and 4 mil.

FIGS. 4a-4f represent different levels of the direct wafer probe 10 of FIG. 2. FIGS. 4a-4f further show exemplary dimensions of the features of the present invention, e.g., ground vias, signal vias, opening, etc. It should be understood by those of skill in the art that the dimensions shown in FIGS. 4a-4f are illustrative examples and that other dimensions are also contemplated by the present invention as determined with the flow process shown in FIG. 10.

Figure 4:
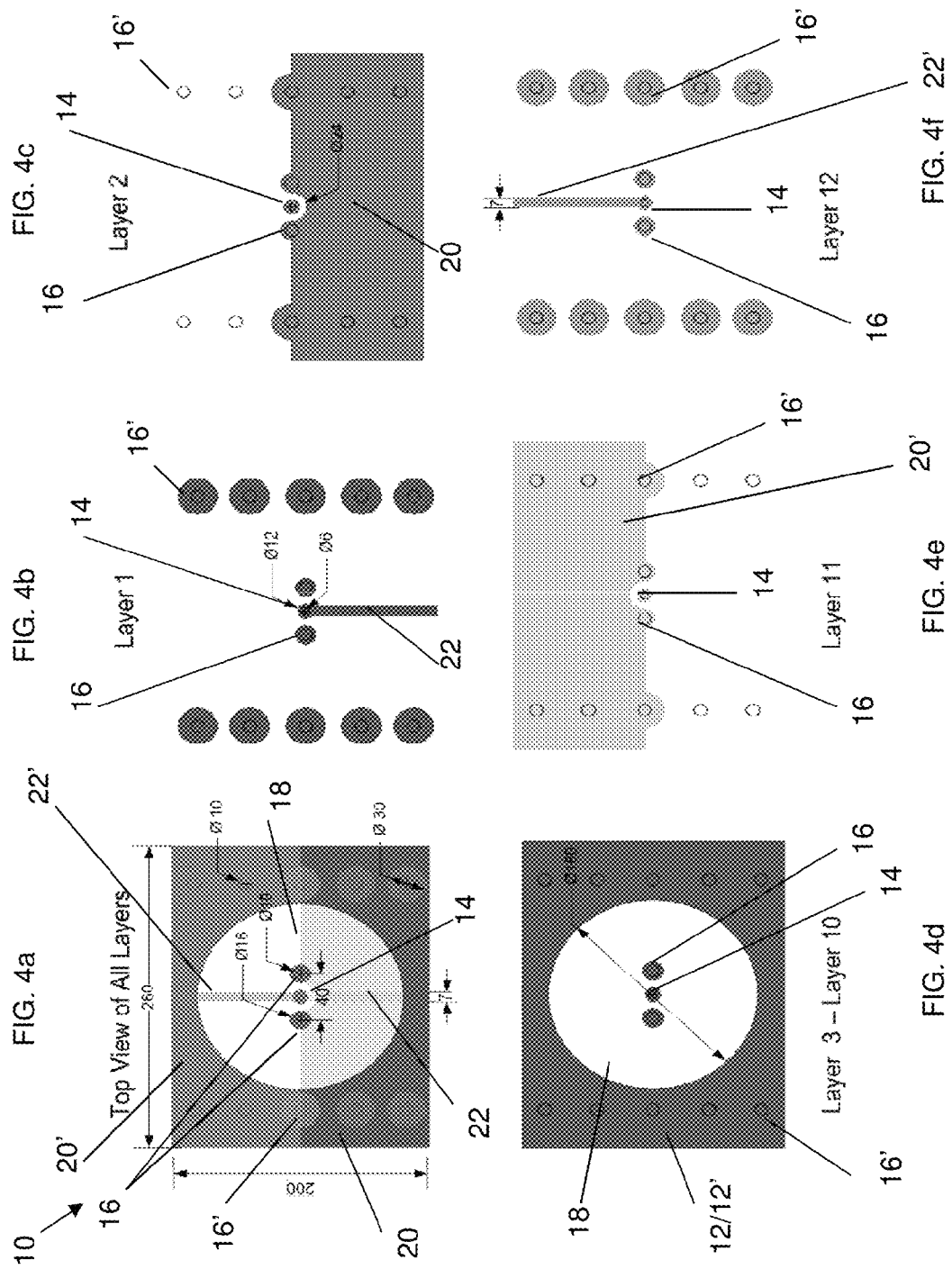
FIGS. 4a-4f show different levels of the direct wafer probe of FIG. 2.

FIG. 4a shows a top view of the direct wafer probe 10. As shown in this representation, the signal via 14 and the ground vias 16 are formed in the opening 18 of the alternating layers 12, 12'. In embodiments, the alternating layers 12, 12' have a dimension of 200 mil by 260 mil; although other dimensions are contemplated by the present invention. The secondary ground vias 16' are formed within the alternating layers 12, 12', and are positioned symmetrically outside of the opening 18. The secondary ground vias 16' have various dimensions, e.g., about 10 mil, and the diameter of protection pads for the ground vias 16' is about 30 mil. In embodiments, 10 secondary ground vias 16' are positioned about the opening 18; although any number of ground vias 16' is contemplated by the present invention.

As further shown in FIG. 4a, the top ground plate 20 is positioned above the top metal layer, connected to the ground vias 16; whereas, a bottom ground plate 20' is positioned below the bottom metal layer, connected to the ground vias 16 (see FIG. 6e). In embodiments, the microstrip signal lines 22, 22' are connected to the signal via 14 at respective ends, each with a width of about 7 mil. The ground vias 16 have a dimension (diameter) of about 10 mil and 16 mil, with a distance between center points of about 40 mil. The signal via 14 is centered between the ground vias 16.

FIG. 4b shows a first layer of the structure of FIG. 2, above the top metal plate. In this representation, the signal via 14 and the ground vias 16 extend above the opening 18. The microstrip signal line 22 is connected to the signal via 14, which has a diameter of about 6 mil and the diameter of protection pad for the signal via 14 is about 12 mil.

FIG. 4c shows a next layer (layer 2) of the structure. In particular, this layer is a ground plane layer, in which the top ground plate 20 is connected to the ground vias 16 and secondary ground vias 16'. The top ground plate 20 partially surrounds the signal via 14. For example, the top ground plate 20 can have a radius of about 24 mil, around the signal via 14. The ground plate 20 has an opening or extends only partially across the multiple layers to accommodate the signal vias 14 and connections thereto.

FIG. 4d shows middle layers 12, 12' (layers 3-10) of the structure. In particular, these middle layers represent the formation of opening 18 in the alternating layers 12, 12'. In embodiments, the signal via 14 and the ground vias 16 are formed within the opening 18. In embodiments, the opening 18 has a diameter of preferably about 160 mil for peak performance; although other dimensions are also contemplated by the present invention as described with reference to FIG. 10.

FIG. 4e shows a next layer (layer 11) of the structure. In particular, this layer is a bottom ground plane layer, in which the bottom ground plate 20' is connected to the ground vias 16 and secondary ground vias 16'. The bottom ground plate 20' is positioned below the opening and partially surrounds the signal via 14. In embodiments, the bottom ground plate 20' can have a radius of about 24 mil, around the signal via 14. The ground plate 20 has an opening or extends only partially across the surface of the multiple layers to accommodate the signal vias 14 and connections thereto.

FIG. 4f shows a lower layer (layer 12) of the structure. In particular, in this layer the ground vias 16 and secondary ground vias 16' are below the opening, at a bottom side of the structure. The microstrip signal line 22' is connected to the signal via 14, at this level.

Figure 5:
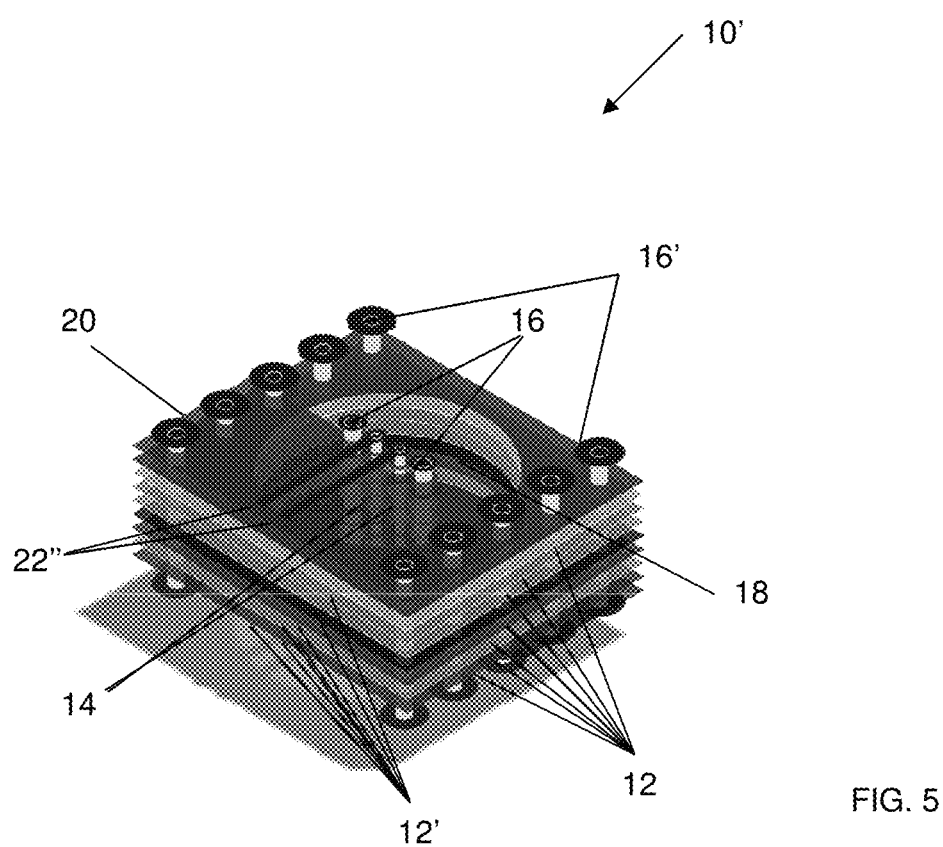
FIG. 5 shows a structure and respective processing steps in accordance with additional aspects of the present invention.

FIG. 5 shows a structure and respective processing steps in accordance with additional aspects of the present invention. In particular, the direct wafer probe 10' includes two signal vias 14 and two ground vias 16 (ground-signal-signal-ground transmission line format), formed within an opening 18. The direct wafer probe 10' can be a coupled broadband through PCB via structure to support above wafer probing solution for millimeter wave signal. In embodiments, the signal vias 14 are positioned between the ground vias 16 within the opening 18 as further described with respect to FIGS. 6a-6f. Top microstrip signal lines 22" are connected to the signal vias 14. Also, as shown in FIG. 6f, bottom microstrip signal lines 22''' are connected to the signal vias 14, at the bottom end thereof. The remaining features and fabrication processes of the direct wafer probe 10' are similar to that of direct wafer probe 10, such that no further explanation is required.

FIGS. 6a-6f represent different levels of the direct wafer probe 10' of FIG. 5. FIGS. 6a-6f further show exemplary dimensions of the features of the present invention, e.g., ground vias, signal vias, opening, etc. It should be understood by those of skill in the art that the dimensions shown in FIGS. 6a-6f are illustrative examples and that other dimensions are also contemplated by the present invention as determined with the flow process shown in FIG. 10.

Figure 6:
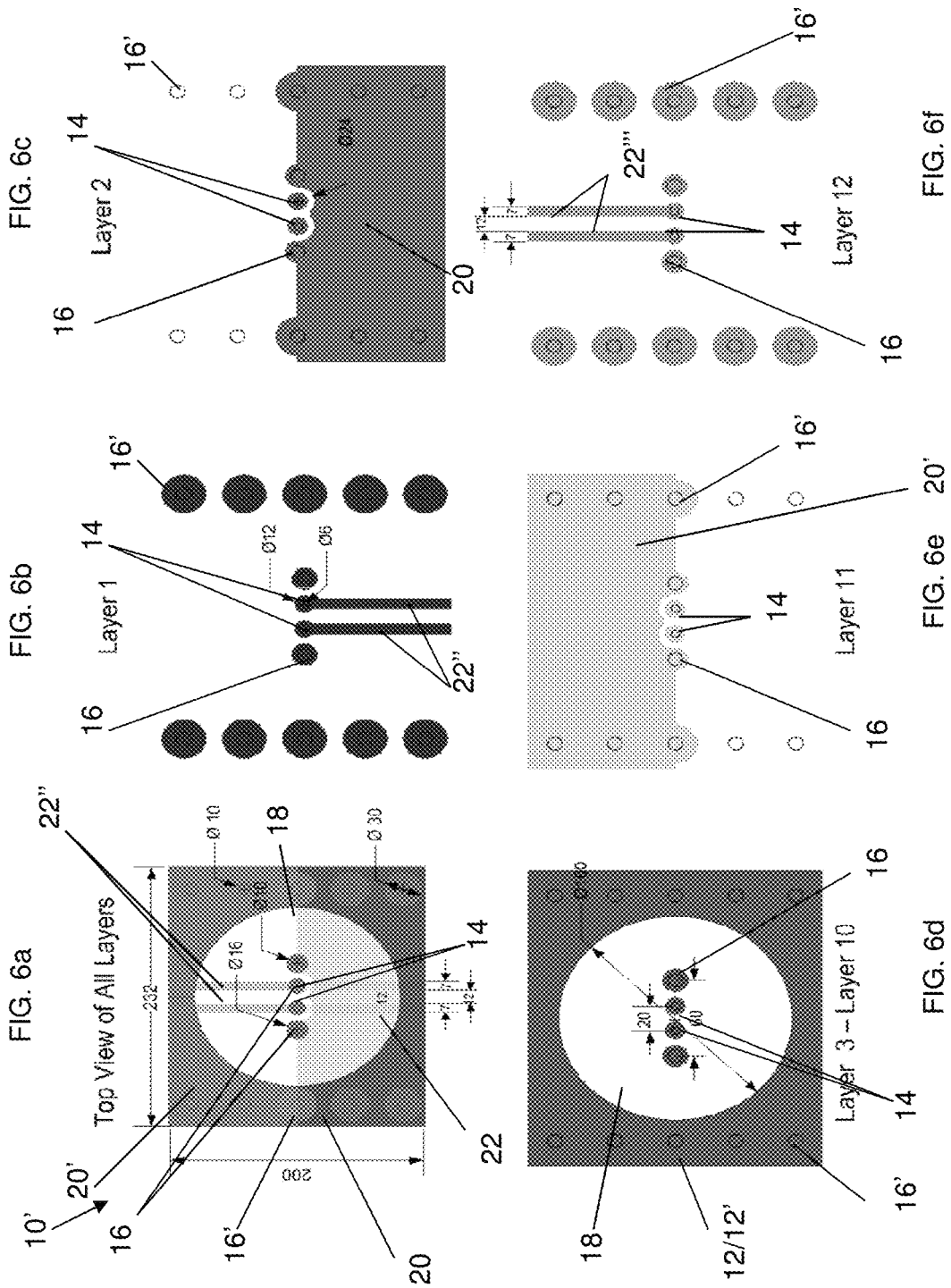
FIGS. 6a-6f show different levels of the direct wafer probe of FIG. 5.

FIG. 6a shows a top view of the direct wafer probe 10'. As shown in this representation, the signal via 14 and the ground vias 16 are formed in the opening 18 of the alternating layers 12, 12'. In embodiments, the alternating layers 12, 12' have a dimension of 200 mil by 260 mil; although other dimensions are contemplated by the present invention. The secondary ground vias 16' are formed within the alternating layers 12, 12', and are positioned symmetrically outside of the opening 18. The secondary ground vias 16' have various have various dimensions, e.g., about 10 mil, and the diameter of protection pads for the ground vias 16' is about 30 mil. In embodiments, 10 secondary ground vias 16' are positioned about the opening 18; although any number of ground vias 16' is contemplated by the present invention.

As further shown in FIG. 6a, the top ground plate 20 is positioned above the top metal layer, connected to the ground vias 16; whereas, the bottom ground plate 20' is positioned below the bottom metal layer, connected to the ground vias 16. In embodiments, the microstrip signal lines 22" are connected to the signal vias 14 at respective ends, each with a width of about 7 mil. The distance between the microstrip signal lines 22" is about 12 mils. The ground vias 16 have a dimension (diameter) of about 10 mil and 16 mil, with a distance between center points of about 40 mil. The signal via 14 is centered between the ground vias 16.

FIG. 6b shows a first layer of the structure of FIG. 5, above the top metal plate. In this representation, the signal vias 14 and the ground vias 16 extend above the opening 18. The microstrip signal lines 22" are connected to the signal vias 14, which have a diameter of about 6 mil and the diameter of protection pad for the signal via 14 is about 12 mil.

FIG. 6c shows a next layer (layer 2) of the structure. In particular, this layer is a ground plane layer, in which the top ground plate 20 is connected to the ground vias 16 and secondary ground vias 16'. The top ground plate 20 partially surrounds the signal vias 14. For example, the top ground plate 20 can have a double radius of about 24 mil, around each signal via 14.

FIG. 6d shows middle layers 12, 12' (layers 3-10) of the structure. In particular, these middle layers represent the formation of opening 18 in the alternating layers 12, 12'. In embodiments, the signal vias 14 and the ground vias 16 are formed within the opening 18. In embodiments, the opening 18 has a diameter of about 160 mil; although other dimensions are also contemplated by the present invention as described with reference to FIG. 10. The ground vias 16 have a distance between center points of about 60 mil; whereas a distance between center points of the signal vias 14 is about 20 mil.

FIG. 6e shows a next layer (layer 11) of the structure. In particular, this layer is a bottom ground plane layer, in which the bottom ground plate 20' is connected to the ground vias 16 and secondary ground vias 16'. The bottom ground plate 20' is positioned below the opening and partially surrounds the signal vias 14. In embodiments, the bottom ground plate 20' can have a radius of about 24 mil, around each signal via 14.

FIG. 6f shows a lower layer (layer 12) of the structure. In particular, in this layer the ground vias 16 and secondary ground vias 16' are below the opening, at a bottom side of the structure. The microstrip signal lines 22''' are connected to the signal vias 14, at this level.

Figure 7:
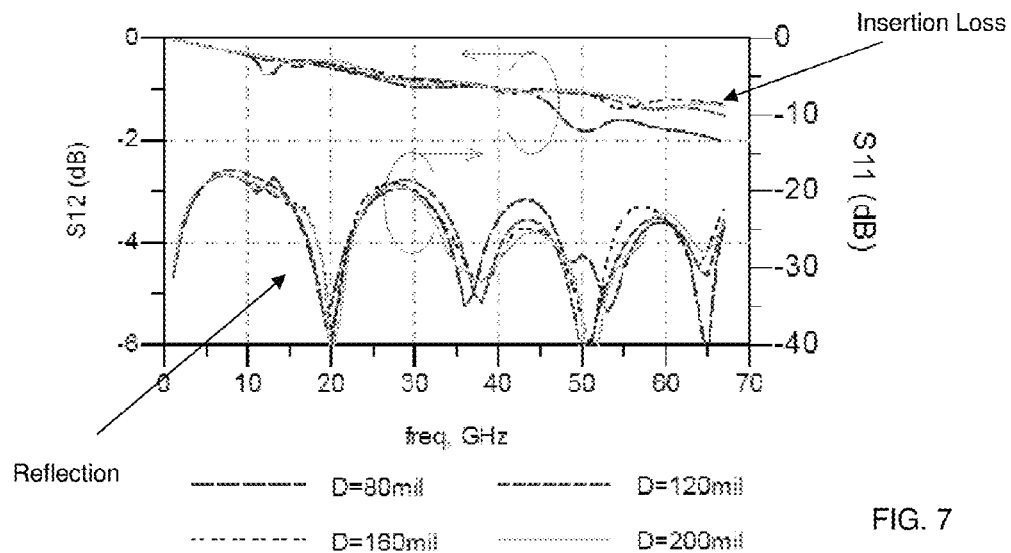
FIG. 7 shows a comparison graph for insertion loss and reflection vs. frequency in accordance with aspects of the present invention.

FIG. 7 shows a comparison graph for insertion loss and reflection vs. frequency in accordance with aspects of the present invention. In particular, this graph shows the different insertion loss and reflection vs. frequency for various diameter openings, e.g., 80 mil, 120 mil, 160 mil and 200 mil. As shown in FIG. 7, for example, the average insertion loss for the 160 mil diameter opening provides the lowest insertion loss. Additionally, the average reflection for the 160 mil diameter opening provides the lowest reflection above 40 GHz. Accordingly, the placement of the signal via(s) and ground vias in a 160 mil diameter opening will provide an improved performance of the direct wafer probe of the present invention. In embodiments, via sizes can also be used for tuning when the PCB constraints allow. For minimum through via structure area and maximum bandwidth, smaller signal via size down to the current PCB via constrains shows better performances.

Figures 8, 9:
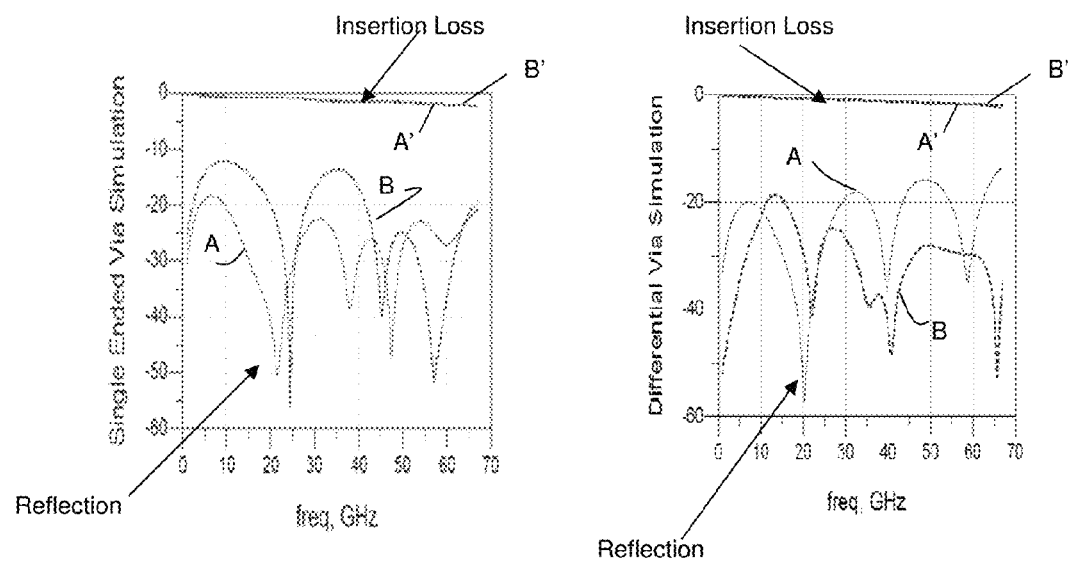
FIG. 8 shows a comparison graph for insertion loss and reflection vs. frequency in accordance with aspects of the present invention.
FIG. 9 shows a comparison graph for insertion loss and reflection vs. frequency in accordance with aspects of the present invention.

FIG. 8 shows a comparison graph for insertion loss and reflection vs. frequency in accordance with aspects of the present invention. More specifically, FIG. 8 shows a comparison of (i) reflection of the direct wafer probe of FIGS. 1a-1c (direct wafer probe 5) with unused pads (line "A") and a direct wafer probe without unused pads (line "B") and (ii) insertion loss of the direct wafer probe 5 with unused pads (line "A"), compared to a wafer probe without unused pads (line "B'"). As shown in this comparison, the average reflection of the wafer probe 5 with unused pads (line "A") shows improved performance vs. the wafer probe without unused pads (line "B"). The average insertion loss of the wafer probe 5 (line "A'") is about equal to that of the wafer probe (line "B'").

It should be understood by those of skill in the art that when there is no inner signal line to be connected with a via, a pad can still be used on inner layers to protect the plating of via or adding extra strength to the board. This non-functional inner pad is referred to as an unused pad. Also, in PCB manufacturing, sometimes all unused pads are removed automatically if the customer does not specially request to keep the unused pads. However, the parasitic of the unused pad has impact on the signal integrity. With this understanding, FIGS. 8 and 9 compare the performance of the via when unused pads are kept and removed.

FIG. 9 shows a comparison graph for insertion loss and reflection vs. frequency in accordance with aspects of the present invention. The graph of FIG. 9 shows comparisons of a ground-signal-signal-ground implementation of FIG. 5. More specifically, FIG. 9 shows a comparison of (i) reflection of the direct wafer probe with unused pads (line "A"), compared to a wafer probe without unused pads (line "B") and (ii) insertion loss of the direct wafer probe 10' with unused pads (line "A'"), compared to a wafer probe without unused pads (line "B'"). As shown in this comparison, the average reflection of the wafer probe without unused pads (line "B") shows improved performance vs. the wafer probe with unused pads (line "A"). The average insertion loss of the wafer probe (line "B'") is about equal to that of the wafer probe (line "B'").

Figure 10:
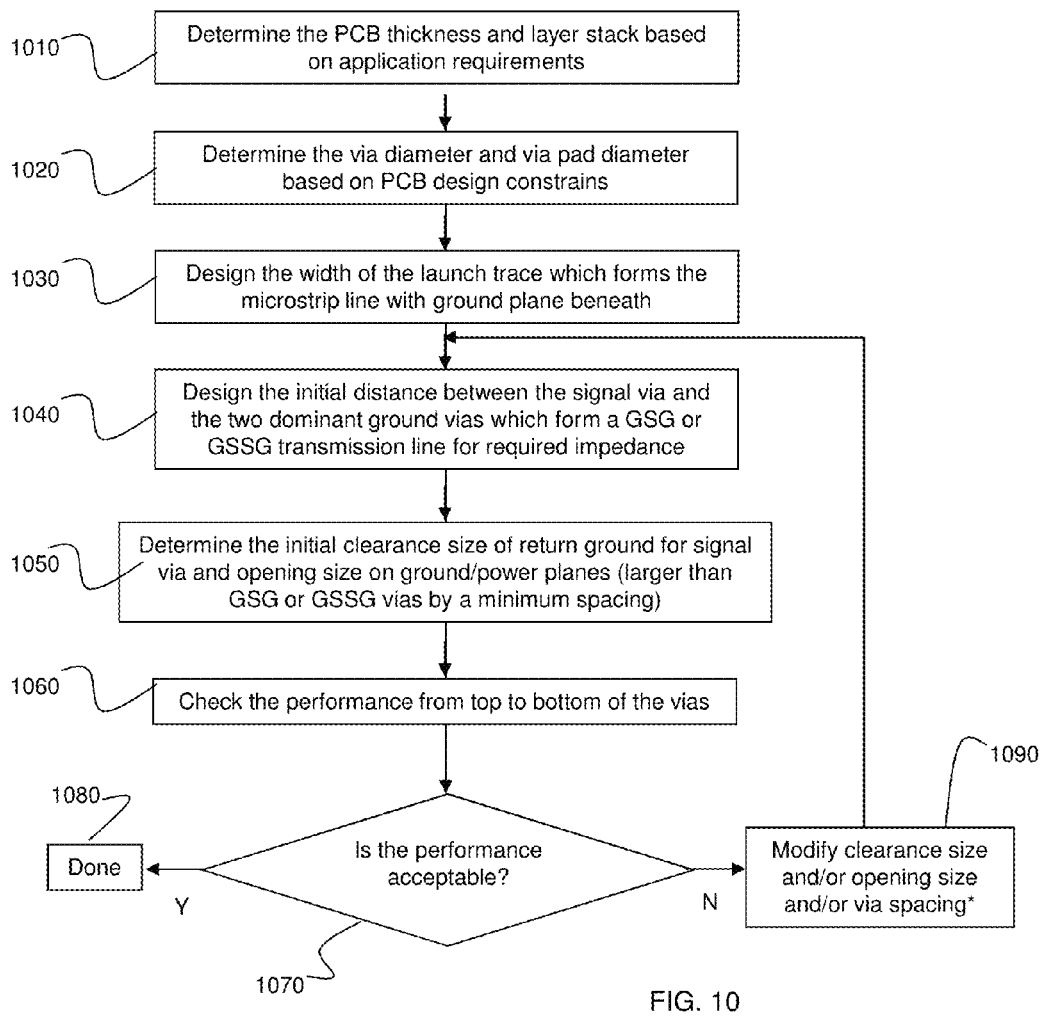
FIG. 10 is a flowchart for designing the wafer probe of the present invention.

FIG. 10 is a flowchart for designing the wafer probe 10, 10' of the present invention. It is noted that each block of the flowchart illustration, and combinations of blocks in the flowchart illustration, can be implemented by special purpose hardware-based systems that perform the specified functions or acts, or combinations of special purpose hardware and computer instructions. In an illustrative example, the flowchart of FIG. 10 can be implemented in an environment that includes a server or other computing system that can perform the processes described herein. In particular, the server includes a computing device. The computing device can be resident on a network infrastructure or computing device of a third party service provider. The computing device includes a processor (e.g., CPU), memory, an I/O interface, and a bus. The memory can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S). The computing device is in communication with external I/O device/resource and storage system. For example, I/O device can comprise any device that enables an individual to interact with computing device (e.g., user interface) or any device that enables computing device to communicate with one or more other computing devices using any type of communications link. In general, the processor executes computer program code (e.g., program control), which can be stored in memory and/or storage system. Moreover, in accordance with aspects of the invention, program control can implement the processes described herein. While executing the computer program code, the processor can read and/or write data to/from memory, storage system, and/or I/O interface. The bus provides a communications link between each of the components in computing device.

The computing device can comprise any general purpose computing article of manufacture capable of executing computer program code installed thereon (e.g., a personal computer, server, etc.). In embodiments, the functionality provided by computing device can be implemented by a computing article of manufacture that includes any combination of general and/or specific purpose hardware and/or computer program code. In each embodiment, the program code and hardware can be created using standard programming and engineering techniques, respectively.

Referring to FIG. 10, at step 1010, a thickness of a PCB is determined based on application requirements. This step may include determining a number of material layers based on application requirements. In embodiments, the thickness of the PCB should be larger than 100 mils, e.g., 130 mils, in order to withstand the stresses of testing. Also, the board should include layers of about equal to or less than 4 mil each and preferably with dimensions noted in FIG. 3. For example, the top and bottom metal (conductive) layers should be about 2 mil (using a standard PCB process) in order to support high frequency applications. In embodiments, 12 layers could be implemented with the present invention, with an additional top and bottom ground layer. In further embodiments, the present invention contemplates the use of about 10 to 15 layers.

At step 1020, the via diameter and via pad diameter are determined based on PCB design constraints. The via diameter and via pad diameter can be determined by the manufacturer as minimum via size and pad size, e.g., about 6 mil; although other dimensions are also contemplated by the present invention.

Figure 11:
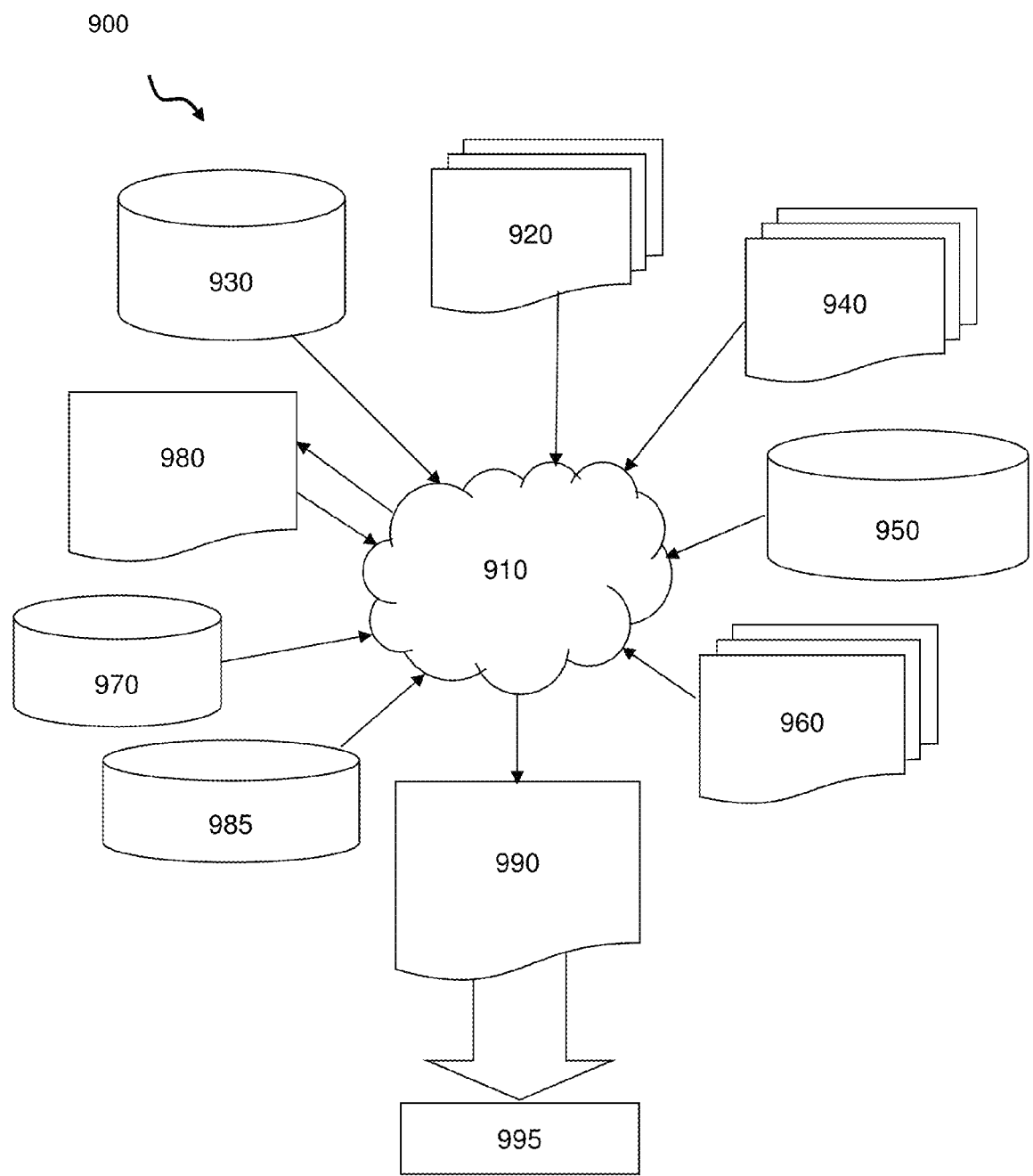
FIG. 11 is a flow diagram of a design process used in semiconductor design, manufacture, and/or test.

At step 1030, the width of the launch trace which forms the microstrip signal line is designed. In embodiments, the microstrip signal line should be able to accommodate a 50 ohm system impedance. In embodiments, the microstrip signal line can be designed using conventional simulation tools known to those of skill in the art. For example, an electromagnetic field simulation tool can be used to design the microstrip signal line taking into account the via size, via spacing, and dielectric material type. Other tools as noted in FIG. 11 are also contemplated by the present invention for determining any of the electrical characteristics described herein.

At step 1040, initial distance between the signal via (signal line) and the two dominant ground vias (ground vias) is designed for a required impedance. In embodiments, the distance of the signal via and the two dominant ground vias can be designed for both the direct wafer probe 10 (ground-signal-ground transmission line format) and direct wafer probe 10' (ground-signal-signal-ground transmission line format) to meet performance requirements. In embodiments, the distance can be calculated using the electromagnetic field simulation tool or other tools to meet certain electrical performances. For example, the electromagnetic field simulation tool can calculate the initial distance by taking into account impedance matching, insertion loss, reflection and frequency within the working frequency range.

At step 1050, initial clearance size of the return ground for the signal via and opening size on ground/power planes by a minimum spacing is determined. Again, this calculation can be made by the electromagnetic field simulation tool, in order to meet certain electrical performances. For example, as shown in FIG. 7, simulations of different sized (diameter) openings can be run on the electromagnetic field simulation tool to determine the optimal insertion loss (e.g., lowest insertion loss) and reflection. This simulation can take into account, for example, the thickness and number of layers in the stack, dimensions of the vias, materials used, etc.

At step 1060, the performance of the signal via is checked from top to bottom. If the performance does not meet the requirements at step 1070, the process proceeds to optional step 1090 to modify clearance size and/or opening size and/or via spacing. Thereafter the process reverts back to step 1040. At any of the steps 1040 and 1050, via sizes can also be used for tuning when the PCB constraints allow. For minimum through via structure area and maximum bandwidth, smaller signal via size down to the current PCB via constrains shows better performances. If the performance meets requirements at step 1070, the process ends at step 1080.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1a-1c, 2, 3, 4a-4f, 5 and 6a-6f. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1a-1c, 2, 3, 4a-4f, 5 and 6a-6f. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1a-1c, 2, 3, 4a-4f, 5 and 6a-6f to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1a-1c, 2, 3, 4a-4f, 5 and 6a-6f. In one embodiment, design structure 990 may comprise a compiled, executable HDL simulation model that functionally simulates the devices shown in FIGS. 1a-1c, 2, 3, 4a-4f, 5 and 6a-6f.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1a-1c, 2, 3, 4a-4f, 5 and 6a-6f. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure, comprising:
a multiple layered body;
an opening in the multiple layered body;
at least one signal via extending through the opening;
ground vias extending through the opening and on opposing sides of the at least one signal via;
a ground plate above and below the opening and electrically connected to the ground vias at respective ends; and
a microstrip signal line above and below the opening and electrically connected to the at least one signal via.

2. The structure of claim 1, wherein the multiple layered body comprises alternating conductive layers and insulating layers.

3. The structure of claim 2, wherein:
the conductive layers are copper or copper alloy; and
a top layer and a bottom layer of the conductive layers are clad in at least one of nickel and gold.

4. The structure of claim 3, wherein the top layer and the bottom layer of the conductive layers has a thickness less than remaining layers of the conductive layers.

5. The structure of claim 1, wherein the ground plate and the microstrip signal line are on different levels.

6. The structure of claim 1, wherein the at least one signal via is two signal vias and the ground vias are provided on opposing sides of the two signal vias.

7. The structure of claim 6, wherein the ground vias are two ground vias.

8. The structure of claim 1, further comprising secondary ground vias provided within holes of the multiple layers and which are symmetrically arranged about the opening.

9. The structure of claim 8, wherein the secondary ground vias comprise self-contained ground shields.

10. The structure of claim 9, wherein the ground vias and the at least one signal via are spaced apart from each other.

11. The structure of claim 10, wherein:
the at least one signal via is two signal vias spaced apart from one another; and
the ground vias is two ground vias.

12. The structure of claim 1, wherein the ground plates partially surround the at least one signal via.

13. A direct wafer probing device, comprising:
a board;
contacts at a bottom of the board;
one or more broadband through conductive vias contacting the contacts at the bottom of the board; and
one or more coaxial connectors on a top of the board, connecting to the one or more broadband through conductive vias.

14. The structure of claim 13, wherein the one or more broadband through conductive vias comprise at least one signal via and two ground vias each of which are on opposing sides of the at least one signal via.

15. The structure of claim 14, wherein the at least one signal via is two signal vias and the two ground vias and two signal vias are configured as a ground-signal-signal-ground.

16. A method of forming a board, comprising:
determining a thickness of a board based on application requirements;
determining via diameter and via pad diameter based on board design constraints;
determining a width of a launch trace which forms a microstrip signal line;
determining an initial distance between a signal via and two dominant ground vias for a required impedance; and
determining an initial clearance size of return grounds for the signal via and an opening size on ground/power planes by a minimum spacing.

17. The method of claim 16, further comprising checking a performance of the signal via from top to bottom and, if the performance is not met, then repeating steps of claim 16 to modify clearance size and/or opening size and/or line spacing.

18. The method of claim 16, wherein the determining the thickness of the board comprises determining a number of material layers use in the board.

19. The method of claim 16, wherein the thickness of the board is about 100-130 mil, in order to withstand stresses of testing.

20. The method of claim 16, wherein the via diameter and via pad diameter are a minimum via size and pad size.

* * * * *